US008922999B2

(12) United States Patent
Lai et al.

(10) Patent No.: US 8,922,999 B2
(45) Date of Patent: Dec. 30, 2014

(54) HEAT DISSIPATING ASSEMBLY AND ELASTIC FASTENING MEMBER THEREOF

(75) Inventors: Jeng-Ming Lai, New Taipei (TW); Sheng-Fu Liu, New Taipei (TW); Tsung-Yu Chiu, New Taipei (TW); Wei-Chung Hsiao, New Taipei (TW)

(73) Assignee: Wistron Corp., New Taipei (TW)

( * ) Notice: Subject to any disclaimer, the term of this patent is extended or adjusted under 35 U.S.C. 154(b) by 308 days.

(21) Appl. No.: 13/620,781

(22) Filed: Sep. 15, 2012

(65) Prior Publication Data
US 2013/0250523 A1    Sep. 26, 2013

(30) Foreign Application Priority Data

Mar. 23, 2012  (TW) ............................... 101110075 A

(51) Int. Cl.
*H05K 7/20* (2006.01)
*H01L 23/40* (2006.01)

(52) U.S. Cl.
USPC ...... 361/709; 361/679.54; 361/704; 361/710; 165/80.2; 165/185; 257/706; 257/718

(58) Field of Classification Search
USPC ............ 361/679.54, 704, 709–710; 165/80.2, 165/185; 257/706, 718
See application file for complete search history.

(56) References Cited

U.S. PATENT DOCUMENTS

| 6,755,104 B2 * | 6/2004 | Grant ............................. 83/140 |
| 6,786,691 B2 * | 9/2004 | Alden, III .................. 411/371.2 |
| 7,342,796 B2 * | 3/2008 | Aukzemas .................... 361/719 |
| 7,606,031 B2 * | 10/2009 | Hsieh et al. .................... 361/700 |
| 7,808,791 B2 | 10/2010 | Li |
| 7,843,696 B2 | 11/2010 | Yeh et al. |
| 2008/0117598 A1 | 5/2008 | Hsu et al. |
| 2008/0219754 A1 | 9/2008 | Lee |
| 2008/0245004 A1 | 10/2008 | Pryor et al. |
| 2010/0008048 A1 | 1/2010 | Urai |

FOREIGN PATENT DOCUMENTS

CN          101312638 A       11/2008

OTHER PUBLICATIONS

Taiwan Patent Office, Office action issued on Apr. 22, 2014.

\* cited by examiner

*Primary Examiner* — Robert J Hoffberg
(74) *Attorney, Agent, or Firm* — Li & Cai Intellectual Property (USA) Office

(57) ABSTRACT

A heat dissipating assembly which releases heat produced by an electronic device comprising a heat dissipating device and a plurality of elastic fastening members. The heat dissipating assembly includes a base plate having a plurality of engaging holes formed thereon. Each elastic fastening member includes a connecting member and a spring. The connecting member has a head portion and a bolt body that extends therefrom. The bolt body has an outer thread formed on the surface thereof and is being insertable into the respective engaging hole. The spring includes a winding portion woundable around the outer periphery of the bolt body, a clutching portion outwardly extended and downwardly bent from the bottom end of the winding portion to the base surface of the base plate, and a fastening segment extending from the clutching portion back under the winding portion. The instant disclosure further provides an elastic fastening member.

18 Claims, 9 Drawing Sheets

HEAT DISSIPATING ASSEMBLY AND ELASTIC FASTENING MEMBER THEREOF

BACKGROUND OF THE INSTANT DISCLOSURE

1. Field of the Instant Disclosure

The instant disclosure relates to a heat dissipating assembly and an elastic fastening member thereof, in particular, to a heat dissipating assembly which has a heat dissipating device to release the remaining heat of the electronic device, and an elastic fastening member which establishes secure contact between the heat dissipating device and the electronic device.

2. Description of Related Art

In order to release the heat produced by the electronic devices, such as a central processing unit (CPU), a heat dissipating device is usually mounted on the electrical device to achieve the object. Furthermore, the heat produced from the electronic device is dissipated by mean of heat conduction to prevent the electronic device from over-heating.

Conventionally, the heat dissipating devices utilize screws and springs for fastening of the circuit boards, such that the electrical devices can be elastically connected to the heat dissipating devices. Generally, the screws and springs are made of metallic engaging rings, such as O-rings or E-rings, and the screws and springs are fastened to the heat dissipating device through the interfering and deforming theorem.

However, the aforementioned fastening method may encounter some potential problems:

1. Higher expense: when the engaging rings are fastened to the springs or screws, a fixture is usually required to complete the fastening procedure. Specifically speaking, the screw is inserted into the spring before exerting a force to depress the spring till reaching a determined distance. The screw is then inserted into the base plate of the heat dissipating device before assembling the engaging ring to the bottom portion of the screw. Therefore, an additional expense spent on the fixture is required to complete the procedure which increases the cost and complexity of the assembling procedures.

2. Higher assembling complexity: when the assembling tool is utilized to pressure on and deform the engaging ring for assembling to the screw, there will be chippings produced due to the abrasion therebetween. What's worse, the chippings may fall into the main board to result in short-circuit. In other condition, when the assembled heat dissipating device, screws and springs are mounted on or dismantled from the main board, there will also be abrasions happening between the base plate of the heat dissipating device and the screws or the engaging rings to produce chippings, where these chippings will also result in the short-circuit of the main board.

To address the above issues, the inventor strives via industrial experience and academic research to present the instant disclosure, which can effectively improve the limitations described above.

SUMMARY OF THE INSTANT DISCLOSURE

The object of the instant disclosure is to provide a heat dissipating device and an elastic fastening member thereof. Hence, the assembling tools can be saved to simplify the assembling procedure. Furthermore, since no engaging rings, which will result in abrasion are utilized, no chippings will be produced to short-circuit the circuit board.

In order to achieve the aforementioned objects, according to an embodiment of the instant disclosure, an elastic fastening member is provided, where the elastic fastening member is fastened to a base plate of a heat dissipating device. The base plate has a plurality of engaging holes formed thereon. The elastic fastening member includes a connecting member and a spring. The connecting member has a head portion and a bolt body that extends from the head portion. The outer surface of the bolt body has an outer thread formed thereon, and the bolt body is being insertable into the respective engaging hole. The spring includes a winding portion woundable around the outer periphery of the bolt body, a clutching portion outwardly extended and downwardly bent from the bottom end of the winding portion to the base surface of the base plate, and a fastening segment extending from the clutching portion back under the winding portion. During assembly, the fastening segment and the clutching portion are threadingly engageable onto the outer thread of the bolt body.

In order to achieve the aforementioned objects, according to an embodiment of the instant disclosure, a heat dissipating assembly is further provided to release the heat produced by the electronic device. The heat dissipating assembly includes a heat dissipating device and a plurality of elastic fastening members. The heat dissipating device has a base plate, where the base plate has a plurality of engaging holes formed thereon. To provide further explanations, the base surface of the base plate is in connection to the electronic device. The plurality of elastic fastening members is arranged in correspondence to the engaging holes. Each of the elastic fastening members includes a connecting member and a spring. The connecting member has a head portion and a bolt body that extends from the head portion. The outer surface of the bolt body has an outer thread formed thereon, where and the bolt body is being insertable into the respective engaging hole. The spring has a winding portion woundable around the outer periphery of the bolt body, a clutching portion outwardly extended and downwardly bent from the bottom end of the winding portion to the base surface of the base plate, and a fastening segment extending from the clutching portion back under the winding portion. During assembly, the fastening segment and the clutching portion are threadingly engageable onto the outer thread of the bolt body.

Based on the above, the instant disclosure has at least the following advantages: the connecting member is rotated to fasten the spring to the heat dissipating device, and thereby, the assembling tools can be saved to simplify the assembling procedure. Furthermore, the outer thread of the connecting member is utilized for fastening the springs to the heat dissipating device. Therefore, the engaging rings which may produce chippings can be saved from using which further reduced the amount of components utilized. In addition, the springs herein designed can also meet the speculation requirement of the CPU.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
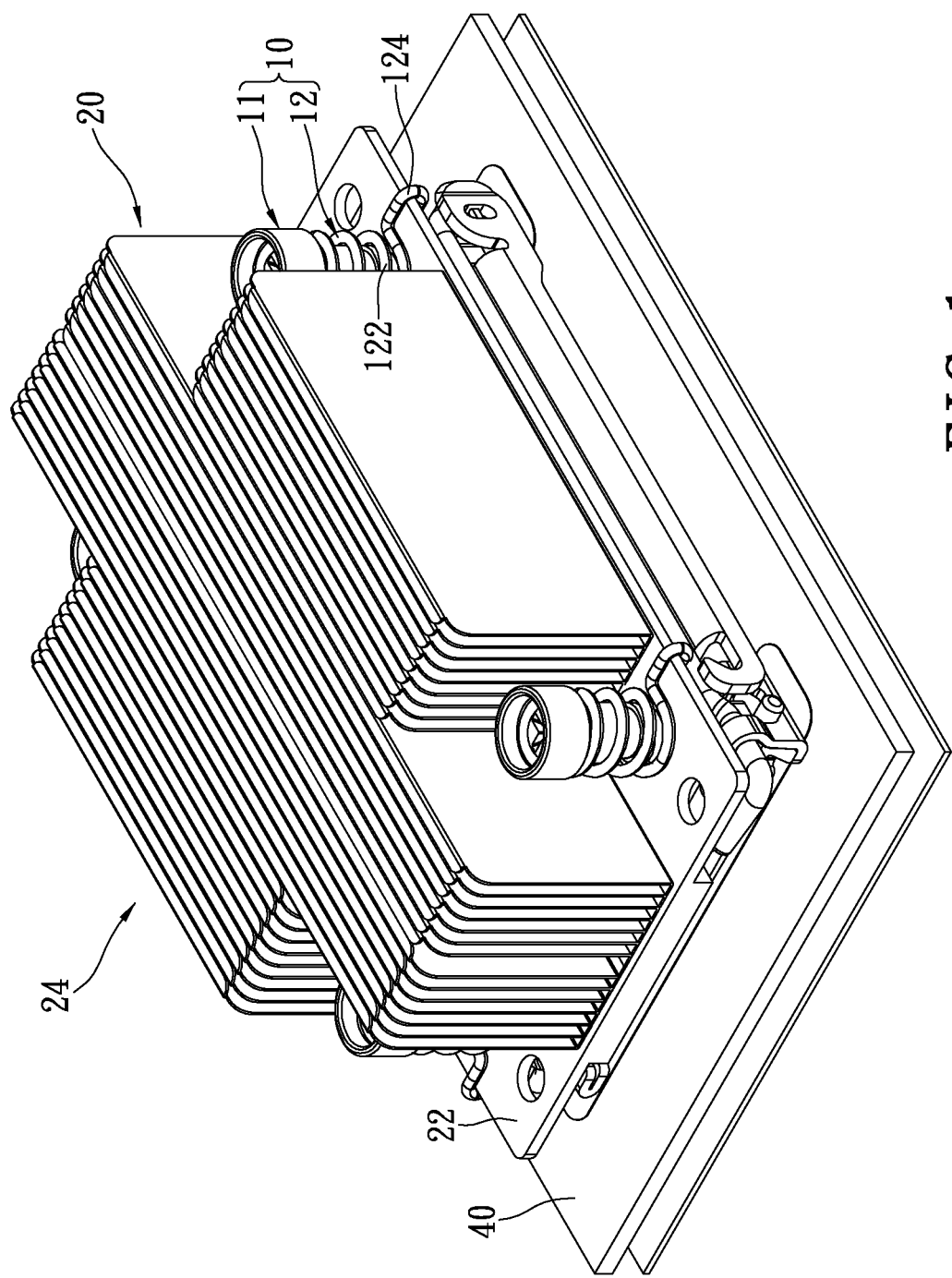
FIG. 1 shows a three-dimensional assembled view of the heat dissipating assembly of the instant disclosure in connection to a circuit board.
Figure 2:
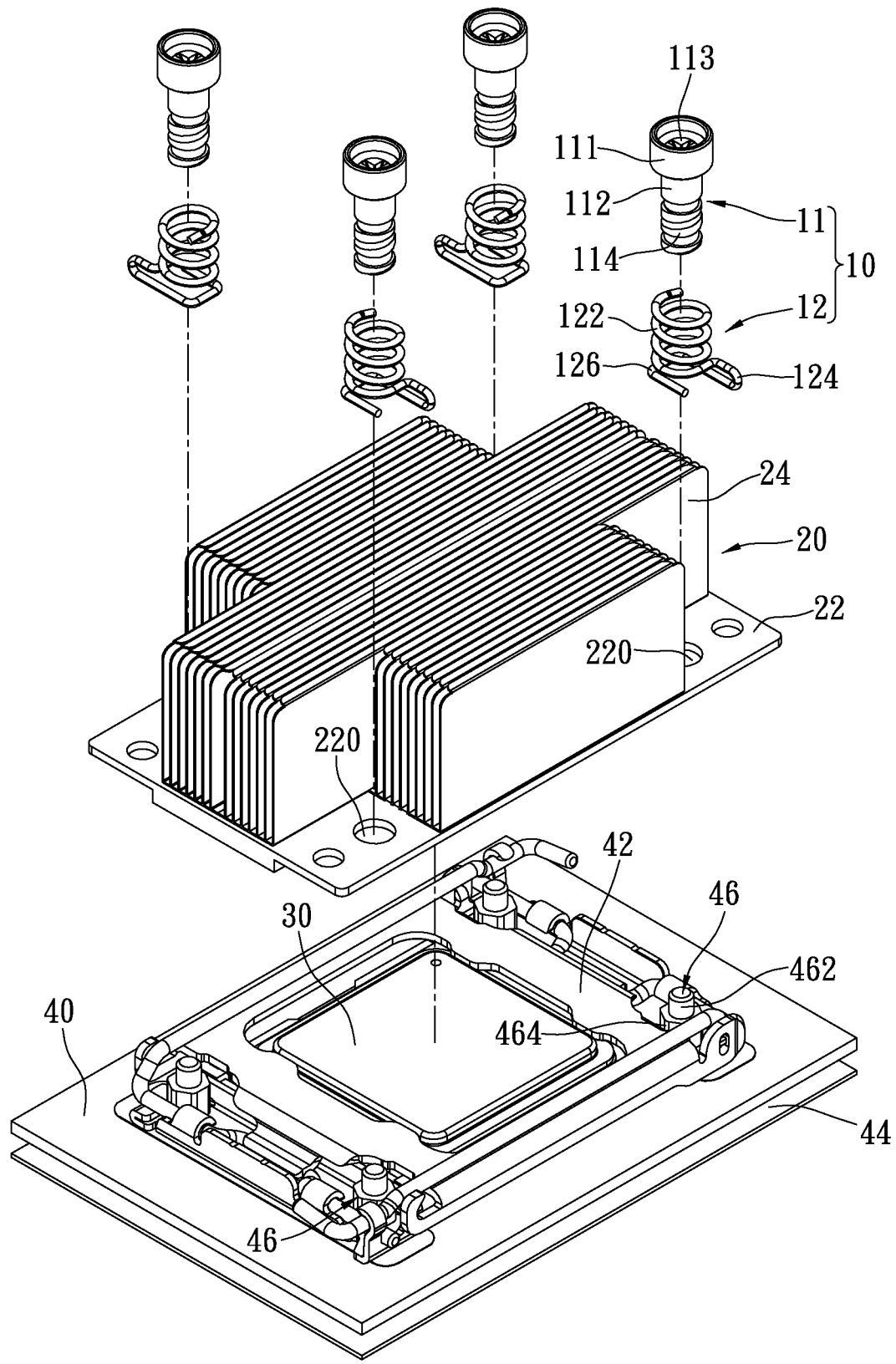
FIGS. 2-3 show a three-dimensional exploded view of the heat dissipating assembly of the instant disclosure in connection to a circuit board.
Figure 3:
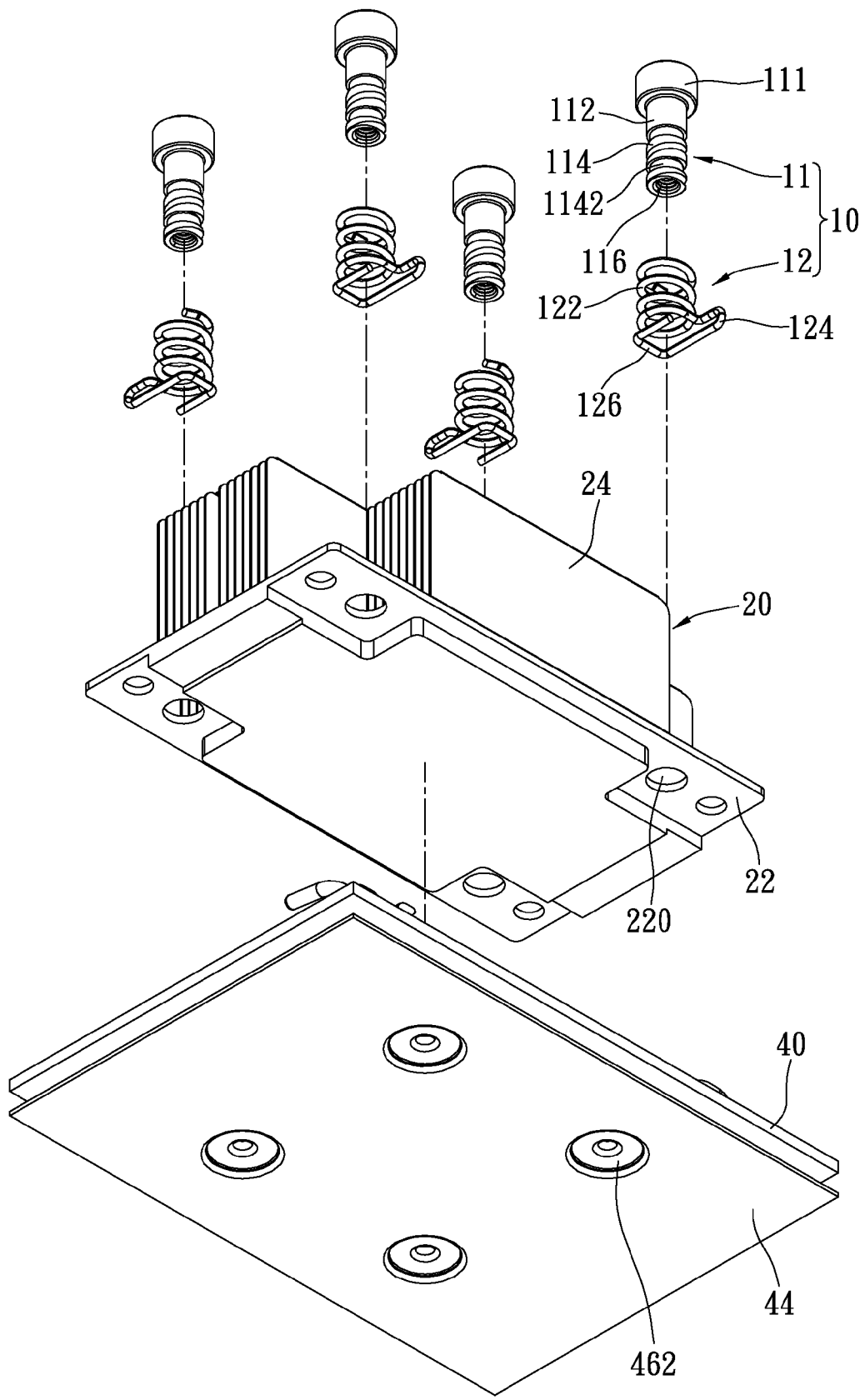

With reference to FIGS. 1-3 which show a three-dimensional assembled view and an exploded view of the heat dissipating assembly of the instant disclosure mounted on the circuit board. The heat dissipating assembly of the instant disclosure includes a heat dissipating device 20 and a plurality of elastic fastening members 10 to release the heat produced by an electronic device 30. For the instant embodiment, the electronic device 30 is a central processing unit (CPU) which is connected electrically to a circuit board 40 through an electrical connector 42. The circuit board 40 has a plurality of nut members 46 arranged on the periphery of the electronic device 30. Each of the nut members 46 includes a nut body 462 and a nut hat 464, where the nut body 462 is inserted into a pad 44 and the circuit board 40. The nut hat 464 fastens the nut body 462 to the circuit board 40. The bottom portion of each of the elastic fastening members 10 is connected to the nut member 46 for the heat dissipating device 20 to fasten to the circuit board 40. Specifically speaking, the heat dissipating assembly of the instant disclosure can be applied on, but not limited to, a CPU, where the heat dissipating assembly can be applied to any electronic device which requires heat dissipation.

The heat dissipating device 20 has a base plate 22 and a plurality of fins 24 arranged on the base plate 22. The base plate 22 has a plurality of engaging holes 220 formed thereon peripherally, and the base surface of the base plate 22 is in connection to the electronic device 30.

With reference to FIG. 2, the elastic fastening members 10 are arranged correspondingly to the engaging holes 220 of the base plate 22. Each of the elastic fastening members 10 includes a connecting member 11, and a spring 12. Each of the connecting members 11 has a head portion 111 and a bolt body 112 that extends from the head portion 111. The top portion of the head portion 111 has a hole 113 formed thereon which has a mating shape with the screw driver. The outer surface of the bolt body 112 has an outer thread 114 formed thereon, and the bolt body 112 body is being insertable into the respective engaging hole 220 of the base plate 22. The bottom portion of the connecting member 11, referring to the bottom portion of the bolt body 112, is fastened correspondingly to the nut member 46. For the instant embodiment, the bottom portion of each of the connecting members 11 has an inner thread 116 concavely formed thereon for fastening to the corresponding nut body 462 of the nut member 46.

However, the instant disclosure can also be expressed in a variant form. For instance, the bottom portion of the connecting member 11 can have an extended screw rod formed thereon, where the diameter of the extended screw rod is smaller than that of the bolt body 112. Correspondingly, the top portion of the nut member 46 can have an inner thread formed thereon for fastening of the extended screw rod of the connecting member 11. Similarly, the connecting member 11 can be fastened to the nut member 46.

With reference to FIG. 3, the outer thread 114 of the bolt body 112 can further has a horizontal trough 1142 formed thereon, where the horizontal trough 1142 is in connection with the outer thread 114 and a predetermined distance is kept between the horizontal trough 1142 and the bottom portion of the bolt body 112.

The spring 12 has a winding portion 122 woundable around the outer periphery of the bolt body 112, a clutching portion 124 outwardly extended and downwardly bent from the bottom end of the winding portion 122 to the bottom surface of the base plate 22, and a fastening segment 126 extending from the clutching portion 124 back under the winding portion 122. The fastening segment 126 clutches to fasten the horizontal trough 1142. The instant disclosure utilizes the clutching portion 124 formed intrinsically from the spring 12 to clutch and fasten to the border of the base plate 22, and the bolt body 112 is clutched and fastened to the outer thread 114 through the fastening segment 126 Therefore, no additional metallic rings, such as the O-ring or the E-ring, are required for fastening. The following description shall introduce the different portions of the spring 12 in detail.

Figure 4:
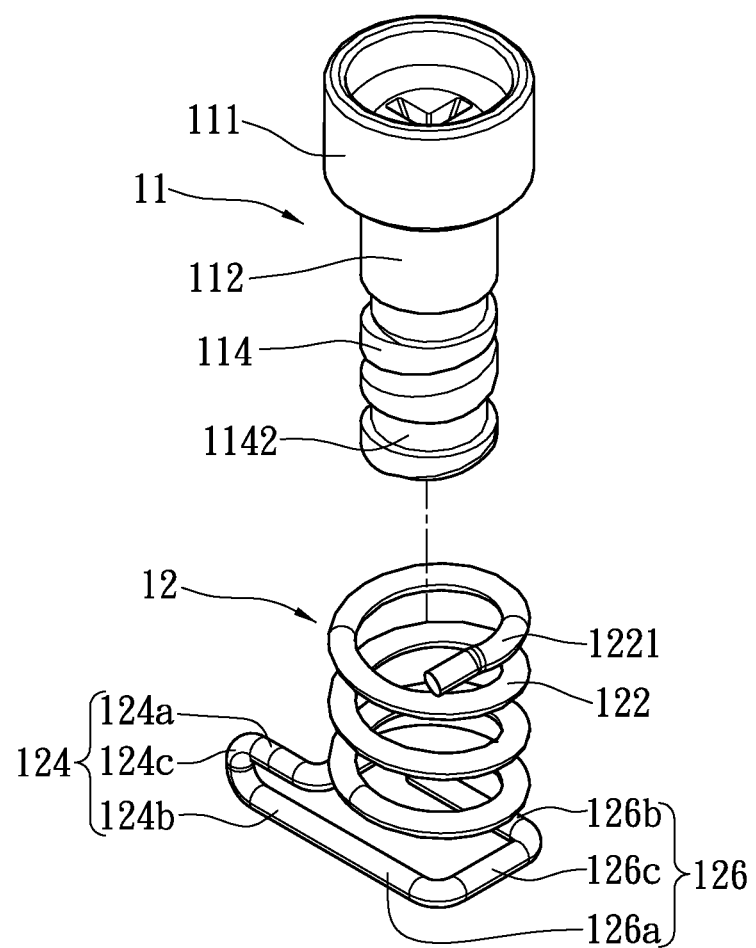
FIGS. 4-5 show a three-dimensional exploded view of the elastic fastening members of the instant disclosure.
Figure 5:
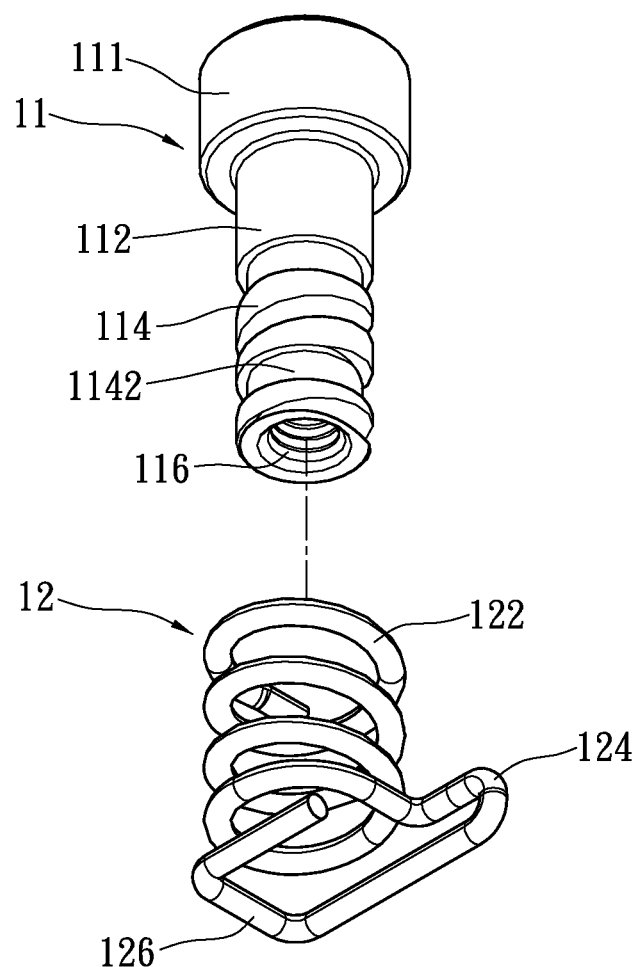
Figure 6:
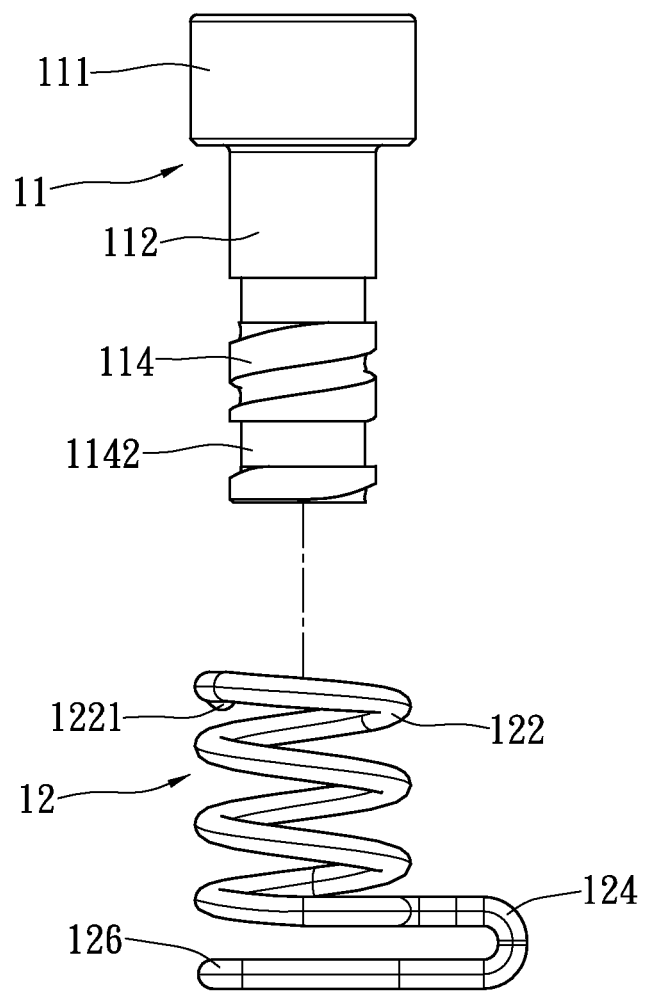
FIG. 6 shows a side view of the elastic fastening members of the instant disclosure.
Figure 7:
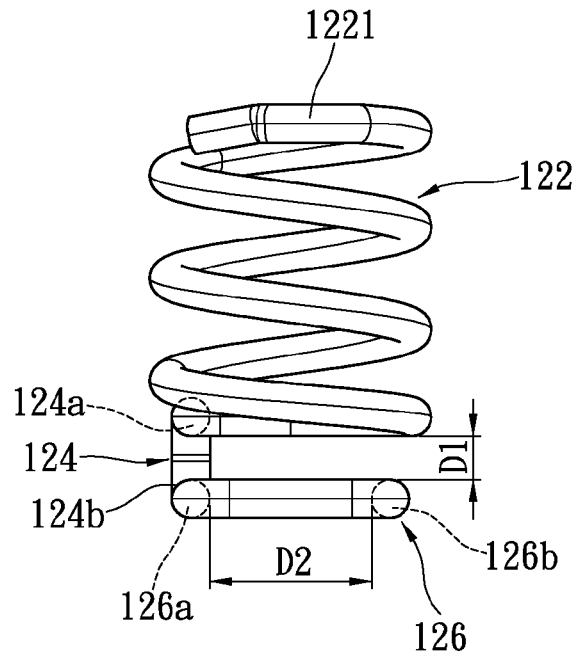
FIG. 7 shows a side view of a spring of the elastic fastening members of the instant disclosure.

Please refer to FIGS. 4-6 which show respectively a three-dimensional exploded view and a side view of the elastic fastening members of the instant disclosure. The number of windings of the winding portion 122 of the instant disclosure can be adjusted depending on the contact pressure between the heat dissipating device 20 and the electronic device 30, and the dimension of the winding portion 122 can also be adjusted accordingly to the dimension of the heat dissipating device 20. Basically, the diameter of the winding portion 122 is greater than that of the bolt body 112, and the diameter of the bolt body 112 is smaller than that of the engaging hole 220. With reference to FIGS. 4 and 7, it is worth noting that the top portion of the winding portion 122 abuts against the head portion 111 of the connecting member 11, and the winding portion 122 has an inclined portion 1221 which extends toward the base surface in a slant manner, away from the head portion 111. For such type of design, the edge of the top portion of the elastic fastening members 10 can be prevented from abrasion with the head portion 111 of the connecting member 11. Thus, metallic chippings which may fall and cause short-circuit to the electrical connector 42 will not be produced.

The clutching portion 124 is connected perpendicularly to the bottom portion of the winding portion 122. Specifically speaking, the clutching portion 124 is a U-shaped structure extending outwardly along the tangent line of the horizontal trough 1142. In other words, the clutching portion 124 is arranged in parallel with the tangent line of the winding portion 122. With reference to FIG. 4, to describe from another angle, the clutching portion 124 includes an upper horizontal segment 124a which bends outwardly from the bottom portion of the winding portion 122, an arched connecting segment 124c which bends downwardly from the upper horizontal segment 124a, and a lower horizontal segment 124b which extends horizontally from the connecting segment 124c towards the winding portion 122.

The clutching portion 124 is arranged on a vertical surface perpendicular to the base plate 22. The inner separation of the clutching portion 124 is shown in FIG. 7. The separation D1 between the upper horizontal segment 124a and the lower horizontal segment 124b is substantially equivalent to the border thickness of the base plate 22 of the heat dissipating device 20. Thus, the clutching portion 124 of the instant embodiment can clutch and fasten directly to the base plate 22. Hence, the spring 12 can be easily fastened to the heat dissipating device 20 of the base plate 22.

Figure 8:
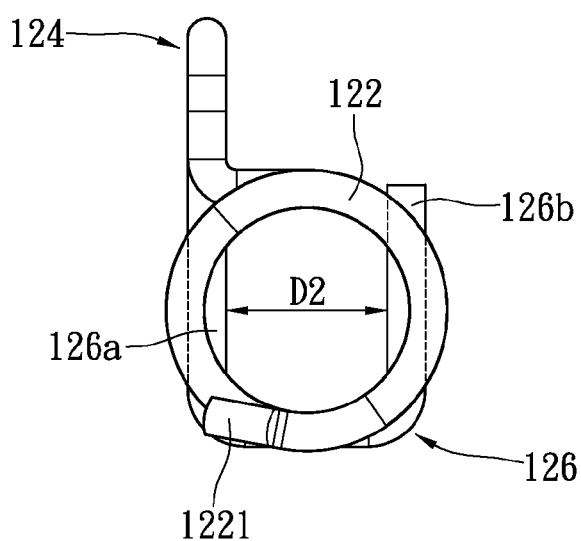
FIG. 8 shows another side view of a spring of the elastic fastening members of the instant disclosure.

Please refer to FIG. 4, the fastening segment 126 is clutched and fastened to the horizontal trough 1142 of the bolt body 112. Specifically speaking, the fastening segment 126 of the instant embodiment and the base plate 22 are arranged in parallel on the same horizontal plane, and the fastening segment 126 is substantially a U-shaped structure. Through observation from another angle, the fastening segment 126 includes a first side portion 126a which extends from the lower horizontal segment 124b of the clutching portion 124, an engaging portion 126c which bendingly extends from the first side portion 126a, and a second side portion 126b which bendingly extends from the engaging portion 126c. The engaging portion 126c is parallel to the tangent line of the winding portion 122. Please refer to FIG. 8, the inner separation D2 of the fastening segment 126, referring to the distance between the first side portion 126a and the second side portion 126b, is substantially equivalent to the diameter of the bolt body 112 in the horizontal trough 1142, where the separation D2 is slightly smaller than the diameter of the winding portion 122.

Figure 9:
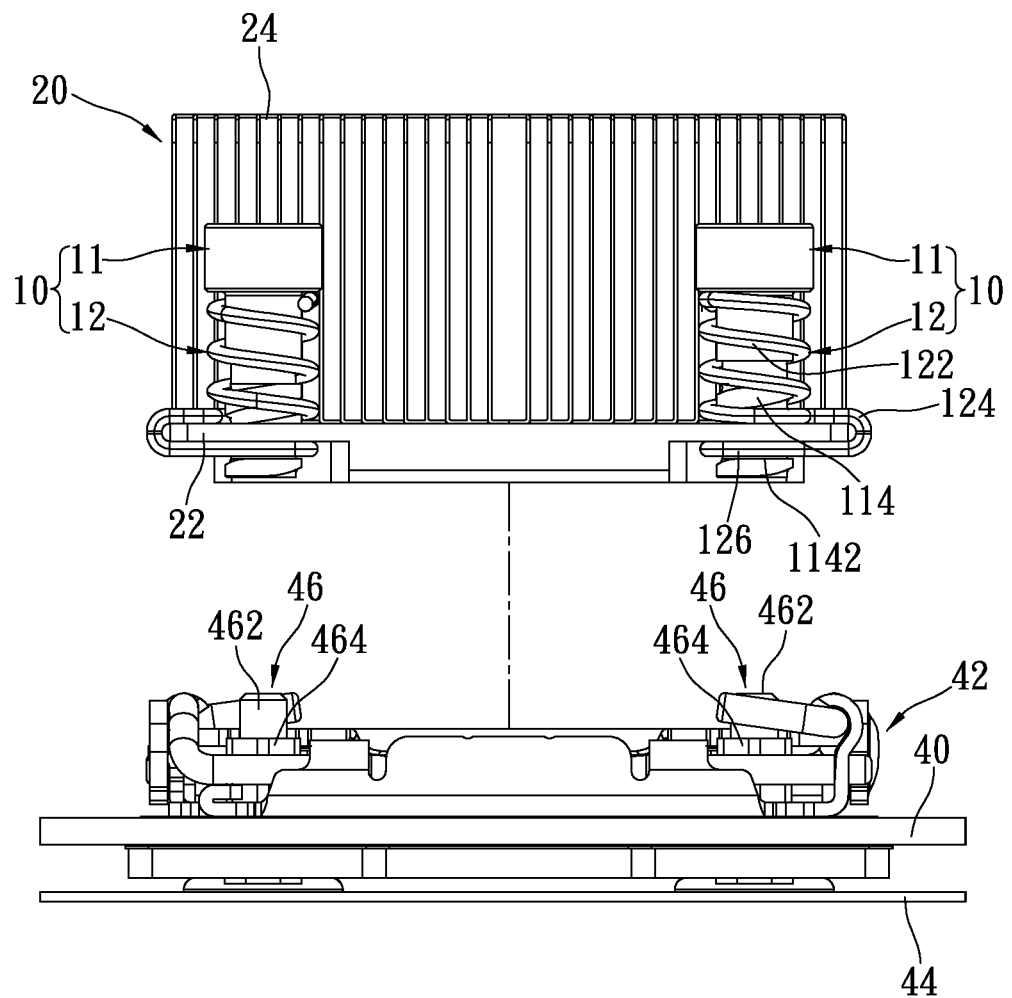
FIGS. 9-10 shows a side view of the heat dissipating assembly of the instant disclosure in connection to the circuit board.
Figure 10:
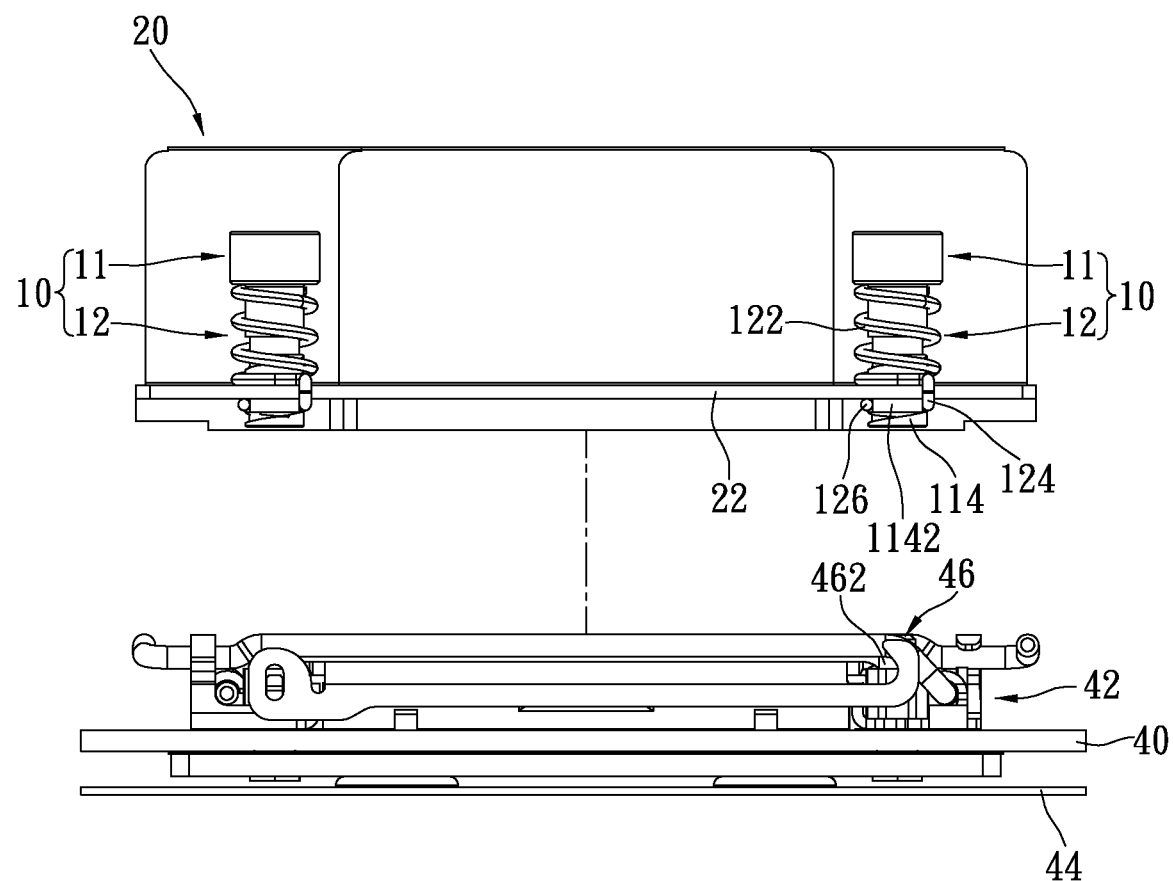

Please refer to FIGS. 9-10 which show a side view of the heat dissipating assembly of the instant disclosure in connection to a circuit board. For the instant disclosure, the clutching portion 124 of the spring 12 is clutched to the border of the base plate 22 from the outer surface of the heat dissipating device 20 during assembly. In other words, the clutching portion 124 is arranged on the periphery of the fin 24. Thus, by the orientation of the figures, the vertical direction, referring to the Y-axis of the spring 12, can be limited by the clutching portion 124. Next, insert the connecting member 11 from the top of the winding portion 122 of the spring 12 for further insertion into the engaging hole 220 (referring to FIGS. 2-3) of the base plate 22. Followed on, the connecting member 11 is rotated for the bolt body 112 to screw into the fastening segment 126, until the fastening segment 126 is inserted into the horizontal trough 1142. With reference to the figures, the horizontal trough 1142 of the bolt body 112 will be positioned on the bottom surface of the base plate 22, and the connecting member 11 will fasten the spring 12 to the base plate 22 of the heat dissipating device 20.

Thus, the assembling procedure of the heat dissipating assembly of the instant disclosure is then completed. Next, the connecting member 11 of the heat dissipating assembly is screwed into the nut body 462 of the nut member 46 for the heat dissipating device 20 to fasten to the circuit board 40 and abut against the electronic device 30 (referring to FIG. 2).

Based on the above, the instant disclosure has at least the following advantages:

1. The assembling procedure is simplified: the structural characteristic of the spring is utilized to replace the springs and engaging rings of the prior art. Therefore, the spring 12 can be fastened to the heat dissipating device 20 by rotating the connecting member 11.

2. The amount of components utilized is reduced: the outer thread of the connecting member is utilized for fastening the springs to the heat dissipating device. Therefore, the O-rings, E-rings or other assembling tools can be saved to reduce the amount of components utilized which further reduces the cost.

3. No chippings will be produced: the U-shaped clutching portion of the spring is clutched to fasten to the outer thread of the connecting member, and thereby, fastening the spring to the heat dissipating device. Therefore, since no engaging rings which will result in abrasion are utilized, no chippings will be produced to short-circuit the circuit board.

5. A design of higher adaptability can be produced: since the rod length of the connecting member, the diameter, the number of windings, and the material of the spring can be controlled by the designer, a design which can meet the speculation requirement of the CPU can be produced. In addition, the spring can be bent or folded to meet the dimension requirement of the heat dissipating device without further adjustment of the heat dissipating device.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims

What is claimed is:

1. An elastic fastening member is provided, comprising:
a connecting member having a head portion and a bolt body that extends from the head portion, wherein an outer surface of the bolt body has an outer thread formed thereon, wherein the outer thread of the bolt body has a horizontal trough formed thereon; and
a spring including a winding portion woundable around an outer periphery of the bolt body, a clutching portion outwardly extended and downwardly bent from a bottom end of the winding portion, and a fastening segment extending from the clutching portion back under the winding portion, wherein the fastening segment is engageable onto the horizontal trough.

2. The elastic fastening member according to claim 1, wherein a bottom portion of the connecting member has an inner thread concavely formed thereon.

3. The elastic fastening member according to claim 1, wherein the horizontal trough is in connection with the outer thread; the fastening segment of the spring is clutched and fastened to the horizontal trough.

4. The elastic fastening member according to claim 3, wherein the clutching portion is a U-shaped structure extending outwardly along a tangent line of the horizontal trough, wherein the clutching portion is connected perpendicularly to the bottom end of the winding portion.

5. The elastic fastening member according to claim 1, wherein a diameter of the winding portion is larger than a diameter of the bolt body.

6. The elastic fastening member according to claim 1, wherein a top portion of the winding portion abuts against the head portion of the connecting member.

7. The elastic fastening member according to claim 6, wherein the winding portion has an inclined portion which extends toward the fastening segment in a slant manner, away from the head portion of the connecting member.

8. The elastic fastening member according to claim 1, wherein the fastening segment is substantially a U-shaped structure which is arranged on a plane.

9. A heat dissipating assembly which releases heat produced from an electronic device, comprising:
a heat dissipating device which has a base plate, wherein the base plate has a plurality of engaging holes formed thereon, and wherein a base surface of the base plate abuts against the electronic device; and
a plurality of elastic fastening members which is in correspondence to the engaging holes; each of the elastic fastening members comprising:
a connecting member having a head portion and a bolt body that extends from the head portion, wherein an outer surface of the bolt body has an outer thread formed thereon, wherein the outer thread of the bolt body has a horizontal trough formed thereon, the bolt body being insertable into a respective engaging hole of the plurality of engaging holes, and a spring including a winding portion woundable around an outer periphery of the bolt body, a clutching portion outwardly extended and downwardly bent from a bottom end of the winding portion toward the base surface of the base plate, and a fastening segment extending from the clutching portion back under the winding portion, wherein the fastening segment is engageable onto the horizontal trough.

10. The heat dissipating assembly according to claim 9, wherein the electronic device is mounted on a circuit board, wherein the circuit board has a plurality of nut members arranged on a periphery of the electronic device.

11. The heat dissipating assembly according to claim 10, wherein the each of the nut members is connected to a bottom portion of the connecting member.

12. The heat dissipating assembly according to claim 11, wherein each of the nut members has an outer thread formed thereon, and the bottom portion of the connecting member has an inner thread concavely formed thereon to screw to the outer thread of the nut member.

13. The heat dissipating assembly according to claim 9, wherein the horizontal trough is in connection to the outer thread and exposed from the base surface of the base plate, the fastening segment of the spring is clutched and fastened to the horizontal trough.

14. The heat dissipating assembly according to claim 13, wherein the clutching portion is connected vertically to the bottom end of the winding portion, and extends outwardly along a tangent line of the horizontal trough, and wherein the clutching portion is a U-shaped structure which clutches and fastens to a side of the base plate.

15. The heat dissipating assembly according to claim 9, wherein a diameter of the winding portion is greater than a diameter of the bolt body, and wherein the diameter of the bolt body is smaller than a diameter of each of the plurality of engaging holes.

16. The heat dissipating assembly according to claim 9, wherein a top portion of the winding portion abuts against the head portion of the connecting member.

17. The heat dissipating assembly according to claim 16, wherein the winding portion has an inclined portion which extends toward the fastening segment in a slant manner, away from the head portion of the connecting member.

18. The heat dissipating assembly according to claim 9, wherein the clutching portion is a U-shaped structure arranged on a horizontal plane parallel to the base plate.

\* \* \* \* \*